US010205117B2

(12) United States Patent
Song

(10) Patent No.: US 10,205,117 B2
(45) Date of Patent: Feb. 12, 2019

(54) ORGANIC LIGHT-EMITTING DIODE DISPLAY SUBSTRATE HAVING AUXILIARY ELECTRODES TO MITIGATE AN INTERNAL RESISTANCE DROP, METHOD FOR MANUFACTURING THE SAME AND DISPLAY DEVICE

(71) Applicant: BOE TECHNOLOGY GROUP CO., LTD., Beijing (CN)

(72) Inventor: Youngsuk Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 14 days.

(21) Appl. No.: 14/892,883

(22) PCT Filed: Mar. 25, 2015

(86) PCT No.: PCT/CN2015/075048
§ 371 (c)(1),
(2) Date: Nov. 20, 2015

(87) PCT Pub. No.: WO2016/082393
PCT Pub. Date: Jun. 2, 2016

(65) Prior Publication Data
US 2016/0359136 A1 Dec. 8, 2016

(30) Foreign Application Priority Data
Nov. 28, 2014 (CN) .......................... 2014 1 0708390

(51) Int. Cl.
*H01L 51/52* (2006.01)
*H01L 27/32* (2006.01)
(52) U.S. Cl.
CPC ...... *H01L 51/5228* (2013.01); *H01L 27/3246* (2013.01); *H01L 27/3248* (2013.01); *H01L 27/3258* (2013.01); *H01L 2227/323* (2013.01)

(58) Field of Classification Search
CPC . H01L 51/5228; H01L 51/5212; H01L 51/56; H01L 27/329; H01L 27/326;
(Continued)

(56) References Cited

U.S. PATENT DOCUMENTS 6,310,496 B1 * 10/2001 Nomura ........... H03K 19/01728
307/412
9,748,512 B2 * 8/2017 Kim .................... H01L 51/5228
(Continued)

FOREIGN PATENT DOCUMENTS

CN     201590412 U     9/2010
CN     102569670 A     7/2012
(Continued)

OTHER PUBLICATIONS

International Search Report for International Application No. PCT/CN2015/075048, dated Sep. 2, 2015.*
(Continued)

*Primary Examiner* — Victoria K Hall
(74) *Attorney, Agent, or Firm* — Harness, Dickey & Pierce, P.L.C.

(57) ABSTRACT

The present disclosure provides an OLED display substrate, its manufacturing method and a display device. The OLED display substrate includes a base substrate, and a TFT and an OLED driven by the TFT on the base substrate and. The OLED includes, in a direction away from the base substrate, an anode, an organic layer and a cathode in turn. The OLED display substrate further includes an auxiliary electrode connected in parallel to a part of the cathode.

11 Claims, 5 Drawing Sheets

(58) Field of Classification Search
CPC .............. H01L 27/3288; H01L 27/3246; H01L 27/3258; H01L 27/32; H01L 2227/323
See application file for complete search history.

(56) References Cited

U.S. PATENT DOCUMENTS

| | | | | |
|---|---|---|---|---|
| 9,831,461 B2* | 11/2017 | Song | ................... | H01L 51/5212 |
| 2004/0251535 A1* | 12/2004 | Nagata | ................ | G06F 17/5068 257/691 |
| 2005/0230757 A1* | 10/2005 | Nagasawa | ......... | G02F 1/136204 257/355 |
| 2006/0113900 A1* | 6/2006 | Oh | ...................... | H01L 27/3276 313/504 |
| 2009/0009068 A1* | 1/2009 | Fujimura | ............ | H01L 27/3276 313/504 |
| 2009/0102753 A1 | 4/2009 | Yamashita et al. | | |
| 2011/0248309 A1* | 10/2011 | Han | ...................... | H01L 27/3288 257/99 |
| 2011/0254757 A1* | 10/2011 | Kim | ...................... | H01L 27/3279 345/76 |
| 2012/0217901 A1* | 8/2012 | Yamanaka | ............ | H01L 27/329 315/312 |
| 2013/0081869 A1* | 4/2013 | Kim | ........................ | G06F 3/044 174/261 |
| 2013/0256638 A1* | 10/2013 | Uesugi | ................ | H01L 51/5228 257/40 |
| 2013/0341607 A1* | 12/2013 | Heo | ........................ | H01L 51/56 257/40 |
| 2014/0186978 A1* | 7/2014 | Kang | ................... | H01L 27/3246 438/23 |
| 2014/0252317 A1* | 9/2014 | Gupta | ................. | H01L 51/5203 257/40 |
| 2014/0346459 A1* | 11/2014 | Song | ................... | H01L 51/5228 257/40 |
| 2014/0374732 A1* | 12/2014 | Jeong | ................. | H01L 27/3246 257/40 |
| 2015/0008398 A1* | 1/2015 | Lee | ..................... | H01L 51/5212 257/40 |
| 2015/0008400 A1* | 1/2015 | Kim | ..................... | H01L 27/3279 257/40 |
| 2015/0014658 A1* | 1/2015 | Choung | .............. | H01L 51/5203 257/40 |
| 2015/0021560 A1* | 1/2015 | Jeong | ...................... | H01L 51/56 257/40 |
| 2015/0041791 A1* | 2/2015 | Lee | ..................... | H01L 27/3276 257/40 |
| 2015/0060809 A1* | 3/2015 | Kim | ..................... | H01L 27/3246 257/40 |
| 2015/0097171 A1* | 4/2015 | Kim | ..................... | H01L 27/3246 257/40 |
| 2015/0102294 A1* | 4/2015 | Choi | ................... | H01L 51/5203 257/40 |
| 2015/0137097 A1* | 5/2015 | Choi | ................... | H01L 27/3258 257/40 |
| 2015/0144906 A1* | 5/2015 | Ichikawa | ............ | H01L 51/5228 257/40 |
| 2015/0144922 A1* | 5/2015 | Moon | ................... | H01L 27/3279 257/40 |
| 2015/0188077 A1* | 7/2015 | Kim | ..................... | H01L 51/5203 257/40 |
| 2016/0035813 A1* | 2/2016 | Lee | ..................... | H01L 27/3276 257/40 |
| 2016/0043341 A1* | 2/2016 | Heo | ..................... | H01L 27/3246 257/40 |
| 2016/0071914 A1* | 3/2016 | Lee | ..................... | H01L 27/3246 257/40 |
| 2016/0118457 A1* | 4/2016 | Kim | ..................... | H01L 27/3279 257/40 |
| 2016/0126304 A1* | 5/2016 | Cho | ..................... | H01L 27/3276 257/40 |
| 2016/0126506 A1* | 5/2016 | Lee | ........................ | H01L 51/56 438/23 |
| 2016/0141545 A1* | 5/2016 | Kim | ..................... | G09G 3/3225 257/40 |
| 2016/0149155 A1* | 5/2016 | Kim | ..................... | H01L 51/5228 257/40 |
| 2016/0155790 A1* | 6/2016 | Lee | ..................... | H01L 27/3276 257/40 |
| 2016/0172425 A1* | 6/2016 | Lee | ..................... | H01L 51/5228 257/40 |
| 2016/0172589 A1* | 6/2016 | Nirengi | ............... | H01L 51/5228 438/99 |
| 2016/0172634 A1* | 6/2016 | Kim | ..................... | H01L 51/5234 257/40 |
| 2016/0190505 A1* | 6/2016 | Koo | ..................... | H01L 51/5228 257/40 |
| 2016/0203765 A1* | 7/2016 | Lee | ..................... | G09G 3/3291 345/76 |
| 2016/0204171 A1* | 7/2016 | Lee | ..................... | H01L 51/5228 257/40 |
| 2016/0211316 A1* | 7/2016 | Oh | ...................... | H01L 27/3279 |
| 2016/0240810 A1* | 8/2016 | Oh | ...................... | H01L 51/5228 |
| 2016/0254455 A1* | 9/2016 | Wang | ..................... | H01L 51/56 438/23 |
| 2016/0293671 A1* | 10/2016 | Aoki | .................. | H01L 51/5209 |
| 2016/0293888 A1* | 10/2016 | Shim | ................... | H01L 27/3246 |
| 2016/0365532 A1* | 12/2016 | Song | ..................... | C23C 14/04 |

FOREIGN PATENT DOCUMENTS

| | | |
|---|---|---|
| CN | 103066212 A | 4/2013 |
| CN | 103700694 A | 4/2014 |
| CN | 103715205 A | 4/2014 |
| CN | 104124259 A | 10/2014 |
| CN | 204179115 U | 2/2015 |
| CN | 104393188 A | 3/2015 |

OTHER PUBLICATIONS

First Office Action regarding Chinese application No. 201410708390.8, dated Apr. 14, 2016. Translation provided by Dragon Intellectual Property Law Firm.

Written Opinion of the International Searching Authority for International application No. PCT/CN2015/075048.

Second Office Action regarding Chinese application No. 201410708390.8, dated Aug. 30, 2016. Translation provided by Dragon Intellectual Property Law Firm.

* cited by examiner ial, identical to the source/drain electrode or the gate electrode of the TFT or the anode, the second auxiliary sub-electrode is arranged at a layer, and made of a material, identical to the source/drain electrode or the gate electrode of the TFT or the anode, and the first auxiliary sub-electrode is arranged at a layer different from the second auxiliary sub-electrode.

ORGANIC LIGHT-EMITTING DIODE DISPLAY SUBSTRATE HAVING AUXILIARY ELECTRODES TO MITIGATE AN INTERNAL RESISTANCE DROP, METHOD FOR MANUFACTURING THE SAME AND DISPLAY DEVICE

CROSS-REFERENCE TO RELATED APPLICATIONS

The present application is the U.S. national phase of PCT Application No. PCT/CN2015/075048 filed on Mar. 25, 2015, which claims a priority of the Chinese patent application No.201410708390.8 filed on Nov. 28, 2014, the entire disclosures of both of which are incorporated herein by reference in their entirety.

TECHNICAL FIELD

The present disclosure relates to the field of display technology, in particular to an organic light-emitting diode (OLED) display substrate, its manufacturing method and a display device.

BACKGROUND

Referring to FIG. 1, which is a schematic view showing an existing top-emission OLED display substrate, the top-emission OLED display substrate includes a base substrate 101, and thin film transistors (TFT) 201, 202 and an OLED 203 arranged on the base substrate 101. The OLED 203 includes, in a direction away from the base substrate 101, an anode 107, an organic layer 109 and a cathode 110. Usually, the cathode 110 is made of a transparent or translucent conductive material by sputtering or depositing. The cathode 110 is thin and has a relatively large resistance, so an internal resistance (IR) drop may be induced when it is applied to a large-size OLED display device, resulting in deteriorated image quality of the OLED display device.

SUMMARY

An object of the present disclosure is to provide an OLED display substrate, its manufacturing method and a display device, so as to prevent the occurrence of an IR drop of the OLED display device due to a large resistance of a cathode.

In one aspect, the present disclosure provides in one embodiment an OLED display substrate, including a base substrate, and a TFT and an OLED driven by the TFT on the base substrate. The OLED includes, in a direction away from the base substrate, an anode, an organic layer and a cathode in turn. The OLED display substrate further includes an auxiliary electrode connected in parallel to a part of the cathode.

Alternatively, the auxiliary electrode is arranged at a layer, and made of a material, identical to a source/drain electrode or a gate electrode of the TFT.

Alternatively, the auxiliary electrode is arranged at a layer, and made of a material, identical to the anode.

Alternatively, the auxiliary electrode includes a plurality of auxiliary sub-electrodes.

Alternatively, the plurality of auxiliary sub-electrodes is arranged at different layers.

Alternatively, the auxiliary electrode includes a first auxiliary sub-electrode and a second auxiliary sub-electrode connected to each other via a first connection hole, the first auxiliary sub-electrode is arranged at a layer, and made of a material, identical to the source/drain electrode or the gate electrode of the TFT or the anode, the second auxiliary sub-electrode is arranged at a layer, and made of a material, identical to the source/drain electrode or the gate electrode of the TFT or the anode, and the first auxiliary sub-electrode is arranged at a layer different from the second auxiliary sub-electrode.

Alternatively, the OLED display substrate includes the base substrate; the gate electrode; a gate insulating layer; an active layer; the source/drain electrode and the first auxiliary sub-electrode arranged at an identical layer and made of an identical material; a planarization protection layer provided with the first connection hole penetrating therethrough; the anode and the second auxiliary sub-electrode arranged at an identical layer and made of an identical material, the second auxiliary sub-electrode being connected to the first auxiliary sub-electrode via the first connection hole; a pixel definition layer by which at least a portion of the anode and at least a portion of the second auxiliary sub-electrode are not covered; an organic layer; and the cathode connected to the second auxiliary sub-electrode.

Alternatively, the anode is connected to the drain electrode via a second connection hole penetrating through the planarization protection layer.

Alternatively, the OLED display substrate further includes a low level line arranged at a layer, and made of a material, identical to the first auxiliary sub-electrode, and the low level line is connected to the first auxiliary sub-electrode and the cathode.

Alternatively, the first auxiliary sub-electrode is connected to the cathode via a third connection hole.

In another aspect, the present disclosure provides in one embodiment a method for manufacturing an OLED display substrate, including steps of forming a TFT and an OLED driven by the TFT on a base substrate. The OLED includes, in a direction away from the base substrate, an anode, an organic layer and a cathode in turn. The method further includes a step of forming an auxiliary electrode connected in parallel to a part of the cathode.

Alternatively, the auxiliary electrode is formed together with a source/drain electrode or a gate electrode of the TFT by a single patterning process.

Alternatively, the auxiliary electrode is formed together with the anode by a single patterning process.

Alternatively, the auxiliary electrode includes a plurality of auxiliary sub-electrodes.

Alternatively, the plurality of auxiliary sub-electrodes is arranged at different layers.

Alternatively, the step of forming the auxiliary electrode connected in parallel to a part of the cathode includes forming a first auxiliary sub-electrode and a second auxiliary sub-electrode of the auxiliary electrode, respectively, the first auxiliary sub-electrode being connected to the second auxiliary sub-electrode via a first connection hole, the first auxiliary sub-electrode being formed together with the source/drain electrode or gate electrode of the TFT or the anode by a single patterning process, the second auxiliary sub-electrode being formed together with the source/drain electrode or gate electrode of the TFT or the anode by a single patterning process, and the first auxiliary sub-electrode being arranged at a layer different from the second auxiliary sub-electrode.

Alternatively, the method includes steps of: forming the gate electrode on the base substrate; forming a gate insulating layer; forming an active layer; forming the source/drain electrode and the first auxiliary sub-electrode by a single patterning process; forming a planarization protection layer and forming the first connection hole penetrating through the planarization protection layer; forming the anode and the second auxiliary sub-electrode by a single patterning process, the second auxiliary sub-electrode being connected to the first auxiliary sub-electrode via the first connection hole; forming a pixel definition layer by which at least a portion of the anode and at least a portion of the second auxiliary sub-electrode are not covered; forming an organic layer; and forming the cathode connected to the second auxiliary sub-electrode.

Alternatively, the method further includes forming a second connection hole penetrating through the planarization protection layer, the anode being connected to the drain electrode via the second connection hole.

Alternatively, the method further includes forming a low level line while forming the source/drain electrode and the first auxiliary sub-electrode by a single patterning process, the low level line being connected to the first auxiliary sub-electrode and the cathode.

Alternatively, the method further includes forming a third connection hole, the first auxiliary sub-electrode being connected to the cathode via the third connection hole.

In yet another aspect, the present disclosure provides in one embodiment a display device including the above-mentioned OLED display substrate.

According to the embodiments of the present disclosure, through the auxiliary electrode connected in parallel to the cathode, it is able to reduce a resistance of the cathode, and prevent the occurrence of an IR drop of the OLED display device due to a large resistance of the cathode, thereby to improve the image quality of the OLED display device.

BRIEF DESCRIPTION OF THE DRAWINGS

FIGS. 4-1 to 4-10 are flow charts of a method for manufacturing the OLED display substrate according to one embodiment of the present disclosure.

DETAILED DESCRIPTION

Figure 1:
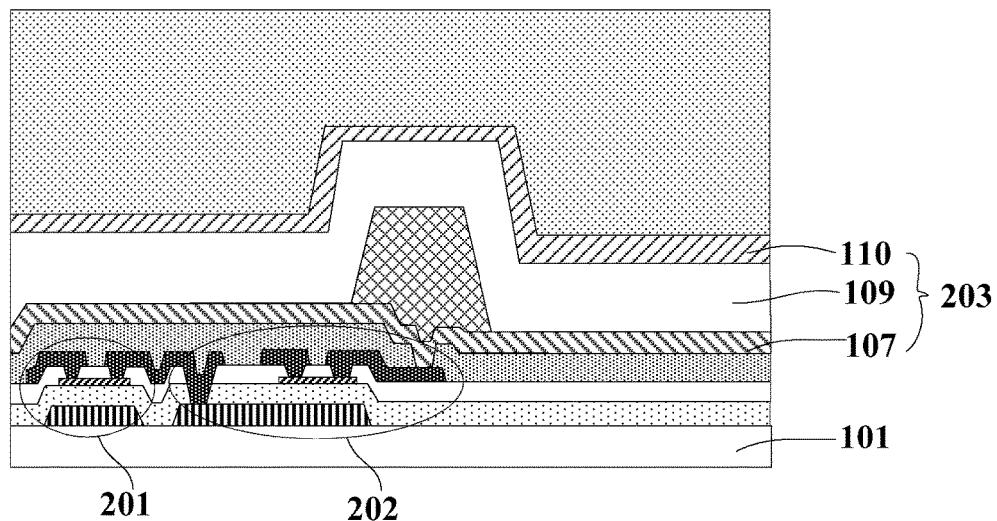
FIG. 1 is a schematic view showing an existing top-emission OLED display substrate.

In order to make the objects, the technical solutions and the advantages of the present disclosure more apparent, the present disclosure will be described hereinafter in conjunction with the drawings and embodiments.

The present disclosure provides in one embodiment an OLED display substrate, which includes a base substrate, and a TFT and an OLED driven by the TFT on the base substrate. The OLED includes, in a direction away from the base substrate, an anode, an organic layer and a cathode in turn. In order to reduce a resistance of the cathode, the OLED display substrate further includes an auxiliary electrode connected in parallel to the cathode.

Through the auxiliary electrode connected in parallel to the cathode, it is able to reduce the resistance of the cathode, and prevent the occurrence of an IR drop of an OLED display device due to a large resistance of the cathode, thereby to improve the image quality of the OLED display device.

The auxiliary electrode may be of various structures, which will be illustrated hereinafter.

In the embodiment of the present disclosure, the auxiliary electrode may be manufactured by a separate patterning process, and it may be arranged above or below the cathode. Furthermore, the auxiliary electrode may be arranged on or under, and in contact with, the cathode. Alternatively, there may be some other layer(s) arranged between the auxiliary electrode and the cathode, and at this time, it is connected in parallel to the cathode via a connection hole or a low level line. The auxiliary electrode may be made of a metallic material with a low resistance, e.g., Al, Ag, Au, Ti, Mo, or an alloy thereof.

In order to reduce the process steps, in the embodiment of the present disclosure, the auxiliary electrode may also be formed together with one layer from among the OLED by a single patterning process.

Alternatively, the auxiliary electrode may be arranged at a layer, and made of a material, identical to a source/drain electrode or a gate electrode of the TFT or the anode.

In the embodiment of the present disclosure, the auxiliary electrode is arranged at one layer from among the OLED display substrate, and in the some other embodiments, the auxiliary electrode may also consist of auxiliary sub-electrodes arranged at least two layers.

Alternatively, the auxiliary electrode may include a first auxiliary sub-electrode and a second auxiliary sub-electrode connected to each other via a first connection hole. The first auxiliary sub-electrode may be arranged at a layer, and made of a material, identical to the source/drain electrode or the gate electrode of the TFT or the anode. The second auxiliary sub-electrode may be arranged at a layer, and made of a material, identical to the source/drain electrode or the gate electrode of the TFT or the anode. The first auxiliary sub-electrode is arranged at a layer different from the second auxiliary sub-electrode.

In the embodiment of the present disclosure, the auxiliary electrode includes two auxiliary sub-electrodes arranged at different layers, and in some other embodiments, the auxiliary electrode may also include three or more auxiliary sub-electrodes arranged at different layers.

The OLED display substrate may be a top-emission OLED display substrate. Usually, in the top-emission OLED display substrate, the cathode is made of a transparent or translucent conductive material.

Figure 2:
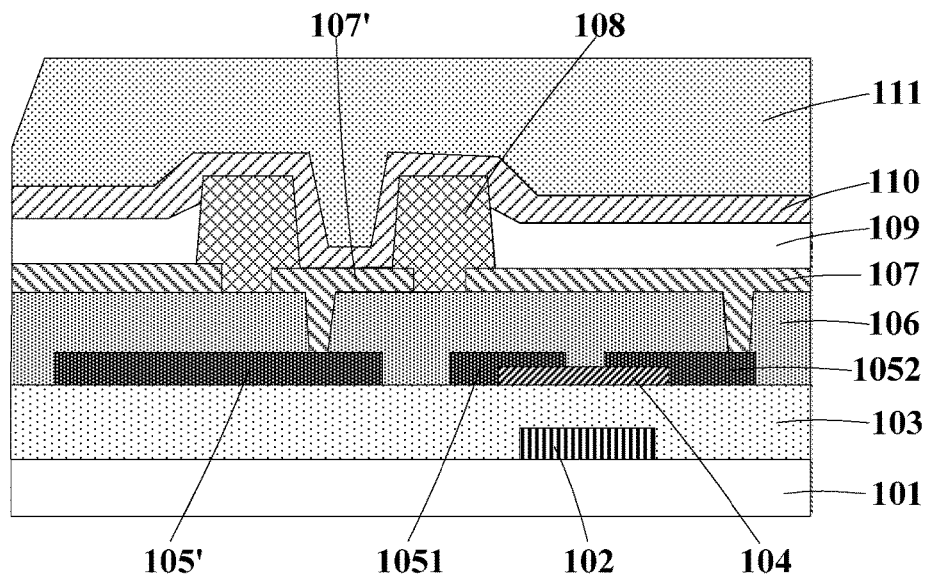
FIG. 2 is a schematic view showing an OLED display substrate according to one embodiment of the present disclosure.

Referring to FIG. 2, which is a schematic view of the OLED display substrate according to one embodiment of the present disclosure, the OLED display substrate specifically includes: the base substrate 101, the gate electrode 102, a gate insulating layer 103, an active layer 104, the source electrode 1051, the drain electrode 1052, the first auxiliary sub-electrode 105', a planarization protection layer 106, the anode 107, the second auxiliary sub-electrode 107', a pixel definition layer 108, an organic layer 109, the cathode 110, and a package protection layer 111. The source electrode 1051, the drain electrode 1052 and the first auxiliary sub-electrode 105' are arranged at an identical layer and made of an identical material, and the first auxiliary sub-electrode 105' is formed together with the source electrode 1051 and the drain electrode 1052 by a single patterning process so as to reduce the process steps. The planarization protection layer 106 is provided with the first connection hole and second connection hole penetrating therethrough, and the planarization protection layer 106 may consist of a passivation layer and a planarization layer. The second connection hole is at a position corresponding to the drain electrode 1052 and the first connection hole is at a position corresponding to the first auxiliary sub-electrode 105'. The anode 107 and the second auxiliary sub-electrode 107' are arranged at an identical layer and made of an identical material. The second auxiliary sub-electrode 107'is connected to the first auxiliary sub-electrode 105'via the first connection hole, and it is formed together with the anode 107 by a single patterning process so as to reduce the process steps. The anode 107 is connected to the drain electrode 1052 via the second connection hole. The pixel definition layer 108 is configured to define different pixel units, and at least a portion of the anode 107 and at least a portion of the second auxiliary sub-electrode 107' are not covered by the pixel definition layer 108. The organic layer 109 covers the portion of the anode 107 that is not covered by the pixel definition layer 108. Because at least a portion of the second auxiliary sub-electrode 107' is not covered by the pixel definition layer 108, the entire layer of the cathode 110 may be directly connected to the portion of the second auxiliary sub-electrode 107'that is not covered by the pixel definition layer.

In the embodiment of the present disclosure, the gate electrode 102, the gate insulating layer 103, the active layer 104, the source electrode 1051 and the drain electrode 1052 form the TFT, and the anode 107, the organic layer 109 and the cathode 110 form the OLED.

Figure 3:
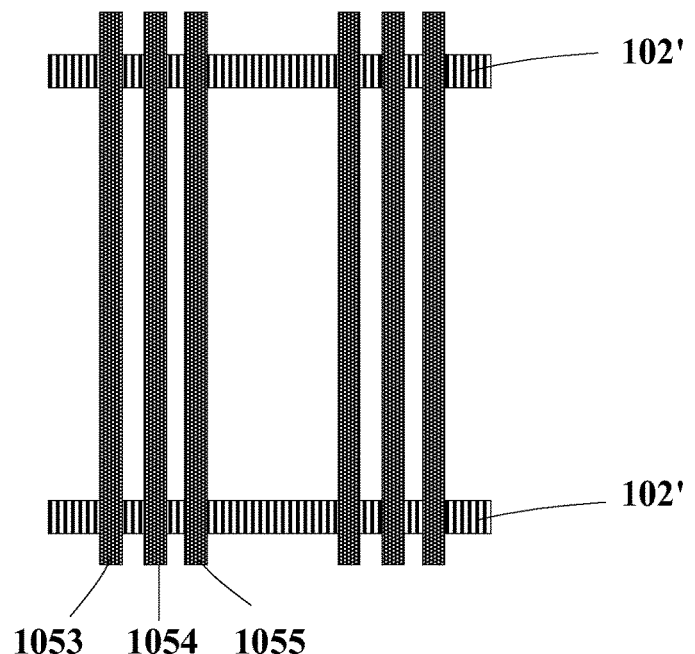
FIG. 3 is a schematic view showing the arrangement of lines of the OLED display substrate according to one embodiment of the present disclosure.

Referring to FIG. 3, which is a schematic view showing the arrangement of lines of the OLED display substrate according to one embodiment of the present disclosure, 102' represents a gate line arranged at a layer and made of a material identical to the gate electrode 102, 1053 represents a data line, 1054 represents the low level line, and 1055 represents a high level line. The data line 1053, the low level line 1054, the high level line 1055, the source electrode 1051, the drain electrode 1052 and the first auxiliary sub-electrode 105' are arranged at an identical layer and made of an identical material, and the low level line 1054 is connected to the first auxiliary sub-electrode 105' and the cathode 110 (to be specific, the low level line 1054 is connected to the cathode via the connection hole), so as to provide a circuit where the first auxiliary sub-electrode 105' is connected in parallel to the cathode 110.

Of course, in the other embodiments of the present disclosure, the first auxiliary sub-electrode 105' may not be connected to the low level line 1054, and instead, it may be directly connected in parallel to the cathode 110 via the connection hole, so as to reduce the resistance of the cathode 110.

In the embodiment of the present disclosure, the auxiliary electrode connected in parallel to the cathode includes two auxiliary sub-electrodes arranged at different layers. One of them is arranged at a layer and made of a material identical to the source electrode 1051 and the drain electrode 1052, and the other is arranged at a layer and made of a material identical to the anode 107. The two auxiliary sub-electrodes are connected in parallel to the cathode, so as to reduce the resistance of the cathode, thereby to prevent the occurrence of IR drop.

The present disclosure further provides in one embodiment a method for manufacturing an OLED display substrate, which includes steps of forming a TFT and an OLED driven by the TFT on a base substrate. The OLED includes, in a direction away from the base substrate, an anode, an organic layer and a cathode in turn. In order to reduce a resistance of the cathode, the method further includes a step of forming an auxiliary electrode connected in parallel to the cathode.

Through the auxiliary electrode connected in parallel to the cathode, it is able to reduce the resistance of the cathode, thereby to prevent the occurrence of IR drop of an OLED display device due to a large resistance of the cathode.

In the embodiment of the present disclosure, the auxiliary electrode may be manufactured by a separate patterning process. In order to reduce the process steps, the auxiliary electrode may also be formed together with one layer from among the OLED by a single patterning process.

Alternatively, the auxiliary electrode may be formed together with a source/drain electrode or a gate electrode of the TFT or the anode by a single patterning process.

In the embodiment of the present disclosure, the auxiliary electrode may be merely formed at one layer from among the OLED display substrate, and in some other embodiments, the auxiliary electrode may also consist of at least two auxiliary sub-electrodes arranged at different layers of the OLED display substrate.

Alternatively, the step of forming the auxiliary electrode connected in parallel to the cathode includes forming a first auxiliary sub-electrode and a second auxiliary sub-electrode of the auxiliary electrode, respectively, the first auxiliary sub-electrode being connected to the second auxiliary sub-electrode via a first connection hole, the first auxiliary sub-electrode being formed together with the source/drain electrode or gate electrode of the TFT or the anode by a single patterning process, the second auxiliary sub-electrode being formed together with the source/drain electrode or gate electrode of the TFT or the anode by a single patterning process, and the first auxiliary sub-electrode being arranged at a layer different from the second auxiliary sub-electrode.

In the embodiment of the present disclosure, the auxiliary electrode includes two auxiliary sub-electrodes arranged at different layers, and in some other embodiments, the auxiliary electrode may also include three or more auxiliary sub-electrodes arranged at different layers.

The present disclosure further provides in one embodiment a display device including the above-mentioned OLED display substrate.

Referring to FIGS. 4-1 to 4-10, which are flow charts of the method for manufacturing the OLED display substrate, the method specifically includes the following steps.

Figures 1, 4:
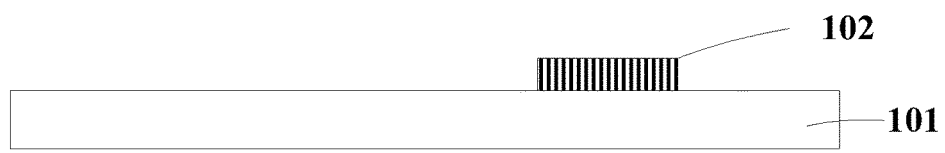
Figures 2, 4:
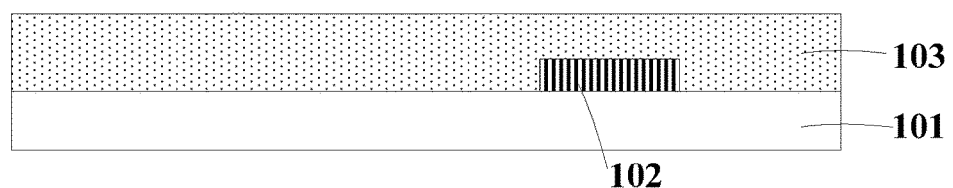
Figures 3, 4:
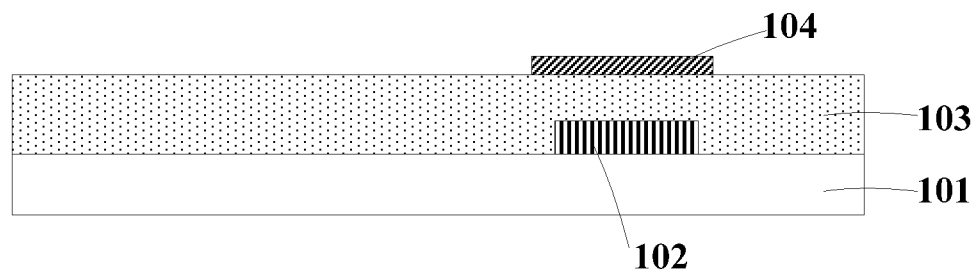
Figure 4:
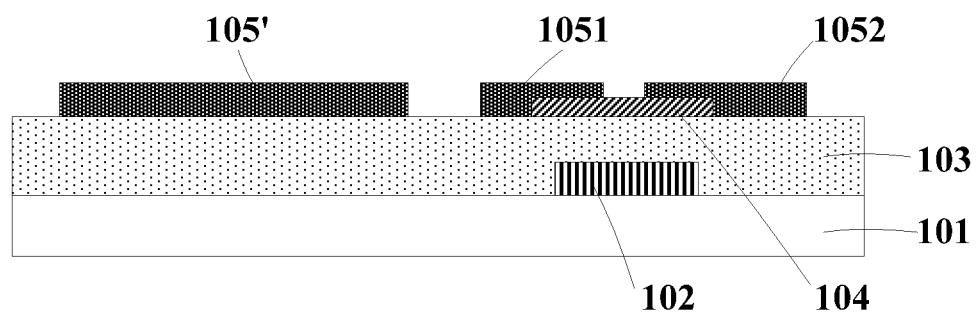

Step S41: referring to FIG. 4-1, forming the gate electrode 102 on the base substrate 101.

Step S42: referring to FIG. 4-2, forming the gate insulating layer 103.

Step S43: referring to FIG. 4-3, forming the active layer 104.

Step S44: referring to FIG. 4-4, forming the source electrode 1051, the drain electrode 1052 and the first auxiliary sub-electrode 105' by a single patterning process.

Figures 4, 5:
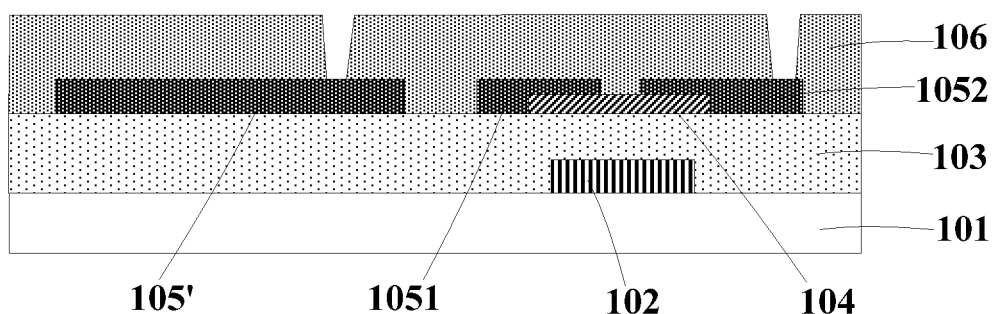

Step S45: referring to FIG. 4-5, forming the planarization protection layer 106, and forming the first connection hole and the second connection hole penetrating through the planarization protection layer 106.

Figures 4, 5, 6:
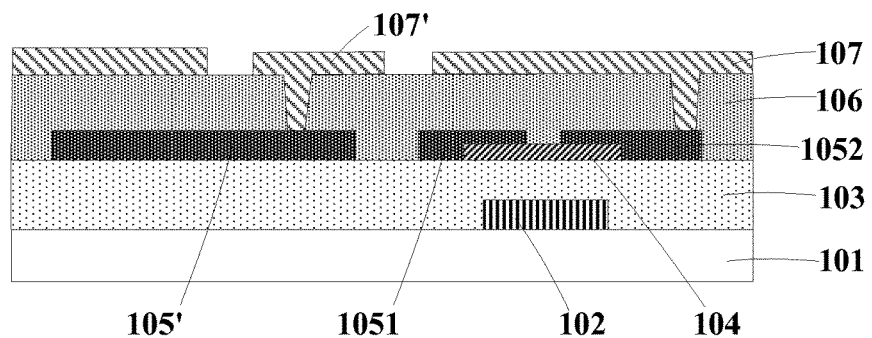
Figures 4, 5, 6, 7:
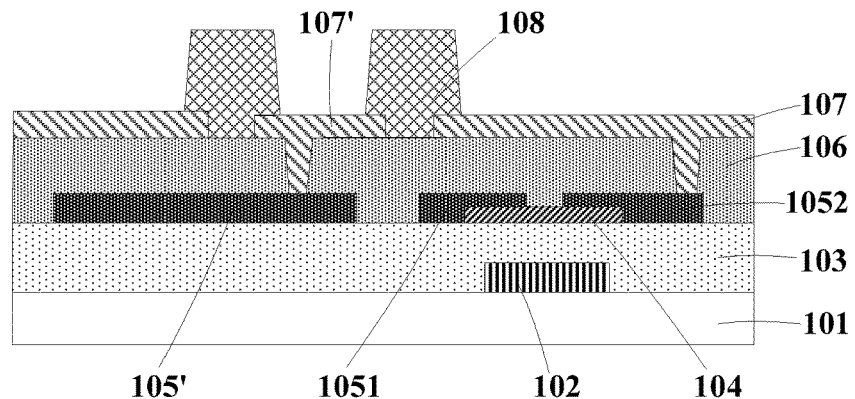
Figures 4, 5, 6, 7, 8:
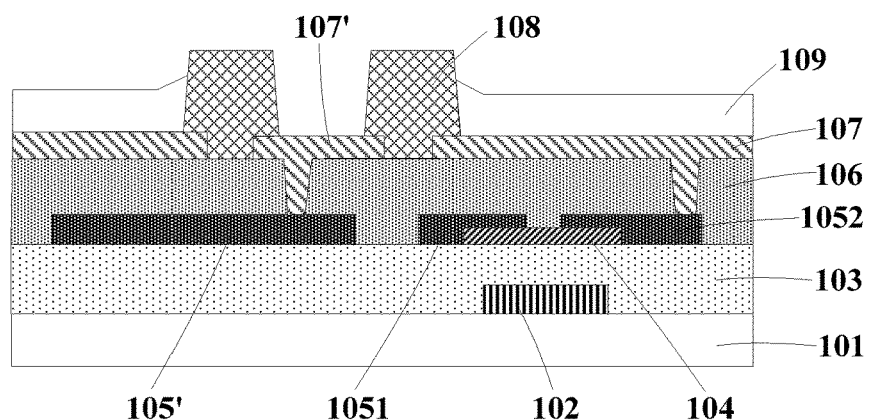
Figures 4, 5, 6, 7, 8, 9:
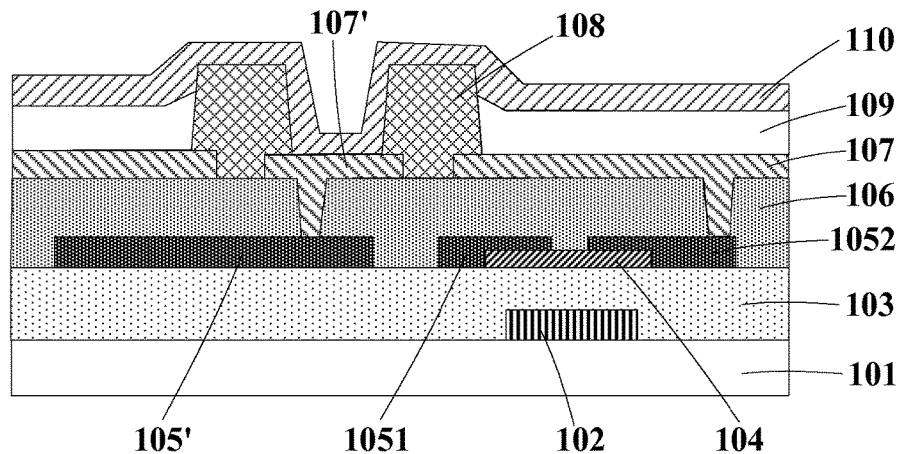
Figures 4, 5, 6, 7, 8, 9, 10:
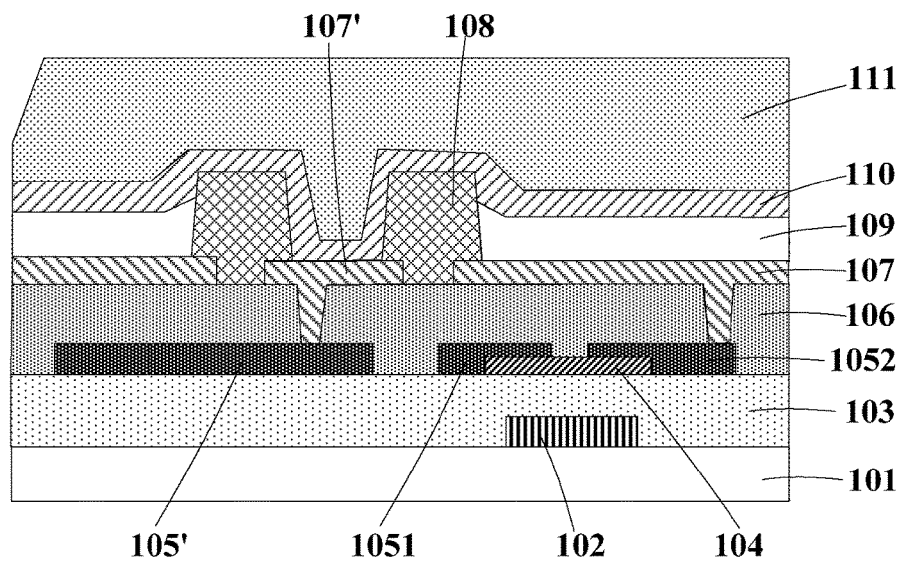

Step S46: referring to FIG. 4-6, forming the anode 107 and the second auxiliary sub-electrode 107' by a single patterning process. The second auxiliary sub-electrode 107'is connected to the first auxiliary sub-electrode 105' via the first connection hole, and the anode 107 is connected to the drain electrode 1052 via the second connection hole.

Step S47: referring FIG. 4-7, forming the pixel definition layer 108 by which at least a portion of the anode 107 and at least a portion of the second auxiliary sub-electrode 107' are not covered.

Step S48: referring to FIG. 4-8, forming the organic layer 109 covering the portion of the anode 107 that is not covered by the pixel definition layer 108. In the embodiment of the present disclosure, the organic layer 109 may be manufactured by fine metal mask (FMM) or semi-open mask.

Step S49: referring to FIG. 4-9, forming the cathode 110. Because at least a portion of the second auxiliary sub-electrode 107' is not covered by the pixel definition layer 108, the entire layer of the cathode 110 is directly connected to the second auxiliary sub-electrode 107' that is not covered by the pixel definition layer. In the embodiment of the present disclosure, a layer of conductive material is deposited by open mask, so as to form the cathode 110.

Step S410: referring to FIG. 4-10, forming the package protection layer 111.

In Step S44, the low level line (not shown) may also be formed while forming the source/drain electrode and the first auxiliary sub-electrode by a single patterning process. The low level line is connected to the first auxiliary sub-electrode and the cathode, so as to provide a circuit where the auxiliary electrode is connected in parallel to the cathode.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An organic light-emitting diode (OLED) display substrate, comprising:
    a base substrate;
    a thin film transistor (TFT);
    a pixel definition layer consisting of a first portion and a second portion and being arranged between two adjacent pixels; and
    an OLED driven by the TFT on the base substrate, the OLED comprising, in a direction away from the base substrate, an anode, an organic layer and a cathode in turn, wherein the OLED display substrate further comprises an auxiliary electrode connected in parallel to a part of the cathode,
    wherein the auxiliary electrode comprises a first auxiliary sub-electrode and a second auxiliary sub-electrode connected to each other via a first connection hole, the first auxiliary sub-electrode arranged at a layer and made of a material identical to at least one of a source electrode, a drain electrode, or a gate electrode of the TFT, the second auxiliary sub-electrode arranged at a layer and made of a material identical to the anode, and the first auxiliary sub-electrode arranged at a layer different from the second auxiliary sub-electrode,
    wherein a projection of at least a portion of the second auxiliary sub-electrode on the base substrate is not overlapped with a projection of the first auxiliary sub-electrode on the base substrate, and the projection of the first auxiliary sub-electrode on the base substrate is not entirely overlapped with a projection of the anode on the base substrate,
    wherein each of the first portion and the second portion of the pixel definition layer is arranged between the second auxiliary sub-electrode and the cathode and is in direct contact with the second auxiliary sub-electrode and the cathode,
    wherein the first portion of the definition layer only covers a portion of the anode and a portion of the second auxiliary sub-electrode, the second portion of the pixel definition layer only covers a portion of an anode of an adjacent pixel and a portion of the second auxiliary sub-electrode, the second auxiliary sub-electrode consists of a first part, a second part, and a third part, the first part is only covered by the first portion of the pixel definition layer, the second part is only covered by the second portion of the pixel definition layer, and the third part is not covered by any one of the first portion and the second portion of the pixel definition layer and the whole third part is only in direct contact with the cathode.

2. The OLED display substrate according to claim 1, wherein both the first auxiliary sub-electrode and the second auxiliary sub-electrode are of a planar structure.

3. The OLED display substrate according to claim 1, wherein:
    the TFT comprises the gate electrode, a gate insulating layer, an active layer, the source electrode, and the drain electrode;
    the source electrode, the drain electrode and the first auxiliary sub-electrode are arranged at an identical layer and made of an identical material;
    a planarization protection layer is provided with the first connection hole penetrating therethrough;
    the anode and the second auxiliary sub-electrode are arranged at an identical layer and made of an identical material, the second auxiliary sub-electrode is connected to the first auxiliary sub-electrode via the first connection hole;
    and
    the cathode is connected to the second auxiliary sub-electrode.

4. The OLED display substrate according to claim 3, wherein the anode is connected to the drain electrode via a second connection hole penetrating through the planarization protection layer.

5. The OLED display substrate according to claim 3, wherein the first auxiliary sub-electrode is connected to the cathode via a third connection hole.

6. The OLED display substrate according to claim 3, wherein the planarization protection layer is arranged between the first auxiliary sub-electrode and the second auxiliary sub-electrode.

7. A display device, comprising the OLED display substrate according to claim 1.

8. A method for manufacturing an organic light-emitting diode (OLED) display substrate, comprising:
    forming a thin film transistor (TFT) and an OLED driven by the TFT on a base substrate, the OLED comprising, in a direction away from the base substrate, an anode, an organic layer and a cathode; and
    forming an auxiliary electrode connected in parallel to a part of the cathode,
    wherein the auxiliary electrode connected in parallel to a part of the cathode includes forming a first auxiliary sub-electrode and a second auxiliary sub-electrode of the auxiliary electrode, respectively, the first auxiliary sub-electrode connected to the second auxiliary sub-electrode via a first connection hole, the first auxiliary sub-electrode formed together with at least one of a source electrode, a drain electrode, or a gate electrode of the TFT by a single patterning process, the second auxiliary sub-electrode formed together with the anode by a single patterning process, and the first auxiliary sub-electrode arranged at a layer different from the second auxiliary sub-electrode,
    wherein a projection of at least a portion of the second auxiliary sub-electrode on the base substrate is not overlapped with a projection of the first auxiliary sub-electrode on the base substrate, and the projection of the first auxiliary sub-electrode on the base substrate is not entirely overlapped with a projection of the anode on the base substrate, wherein a pixel definition layer consists of a first portion and a second portion and is arranged between two adjacent pixels, each of the first portion and the second portion of the pixel definition layer is arranged between the second auxiliary sub-electrode and the cathode and is in direct contact with the second auxiliary sub-electrode and the cathode, wherein the first portion of the pixel definition layer only covers a portion of the anode and a portion of the second auxiliary sub-electrode, the second portion of the pixel definition layer only covers a of an anode of an adjacent pixel and a portion of the second auxiliary sub-electrode, the second auxiliary sub-electrode consists of a first part, a second part, and a third part, the first part is only covered by the first portion of the pixel definition layer, the second part is only cover by the second portion of the pixel definition layer, and the third part is not covered by any one any one of the first portion and the second portion of the pixel definition layer and the whole third part is only in direct contact with the cathode.

9. A method for manufacturing an organic light-emitting diode (OLED) display substrate, comprising:
    forming a base substrate;
    forming a gate electrode on the base substrate;
    forming a gate insulating layer;
    forming an active layer;
    forming a source electrode, a drain electrode, and a first auxiliary sub-electrode by a single patterning process;
    forming a planarization protection layer and forming a first connection hole penetrating through the planarization protection layer;
    forming an anode and a second auxiliary sub-electrode by a single patterning process, the second sub-electrode connected to the first auxiliary sub-electrode via the first connection hole;
    forming a pixel definition layer by which at least a portion of the anode and at least a portion of the second auxiliary sub-electrode are not covered;
    forming an organic layer; and
    forming a cathode, the cathode connected to the second auxiliary sub-electrode, wherein each of a first portion and a second portion of the pixel definition layer is arranged between the second auxiliary sub-electrode and cathode and is in direct contact with the second auxiliary sub-electrode and the cathode, wherein the first portion of the pixel definition layer only covers a portion of the anode and a portion of the second auxiliary sub-electrode, the second portion of the pixel definition layer only covers a portion of an anode of an adjacent pixel and a portion of the second auxiliary sub-electrode, the second auxiliary sub-electrode consists of a first part, a second part, and a third part, the first part is only covered by the first portion of the pixel definition layer, the second part is only covered by the second portion of the pixel definition layer, and the third part is not covered by any one of the first portion and the second portion of the pixel definition layer and the whole third part is only in direct contact with the cathode.

10. The method according to claim 9, further comprising forming a second connection hole penetrating through the planarization protection layer, wherein the anode is connected to the drain electrode via the second connection hole.

11. The method according to claim 9, further comprising forming a third connection hole, wherein the first auxiliary sub-electrode is connected to the cathode via the third connection hole.

* * * * *